US010298227B2

(12) United States Patent
Bunin et al.

(10) Patent No.: US 10,298,227 B2
(45) Date of Patent: May 21, 2019

(54) POWER DEVICE FOR HIGH VOLTAGE AND HIGH CURRENT SWITCHING

(71) Applicant: VISIC TECHNOLOGIES LTD., Nes Ziona (IL)

(72) Inventors: Gregory Bunin, Tel-Aviv (IL); David Shapiro, Rishon LeZion (IL); Lev Stessin, Ashkelon (IL)

(73) Assignee: VISIC TECHNOLOGIES LTD., Nes Ziona (IL)

( * ) Notice: Subject to any disclaimer, the term of this patent is extended or adjusted under 35 U.S.C. 154(b) by 0 days.

(21) Appl. No.: 15/706,121

(22) Filed: Sep. 15, 2017

(65) Prior Publication Data

US 2018/0123585 A1    May 3, 2018

Related U.S. Application Data

(60) Provisional application No. 62/426,248, filed on Nov. 24, 2016, provisional application No. 62/395,125, filed on Sep. 15, 2016.

(51) Int. Cl.
*H03K 17/30*    (2006.01)
*H03K 17/16*    (2006.01)
(Continued)

(52) U.S. Cl.
CPC ............ *H03K 17/687* (2013.01); *H03K 7/08* (2013.01); *H03K 17/102* (2013.01);
(Continued)

(58) Field of Classification Search
CPC ................................ H03K 7/08; H03K 17/687
See application file for complete search history.

(56) References Cited

U.S. PATENT DOCUMENTS 6,404,269 B1 *   6/2002  Voldman .............. H01L 27/0255
                                                              327/534
9,379,698 B2 *   6/2016  Nohra .................. H03K 17/165
                       (Continued)

FOREIGN PATENT DOCUMENTS

DE          4240647         6/1994
JP          5669119        11/2015
                    (Continued)

OTHER PUBLICATIONS

International Search Report of Application No. PCT/IL2017/051277 dated Mar. 13, 2018.
European Search Report of Application No. EP 17191198 dated Jan. 25, 2018.

*Primary Examiner* — Kenneth B Wells
(74) *Attorney, Agent, or Firm* — Pearl Cohen Zedek Latzer Baratz LLP (57) ABSTRACT

An apparatus includes a circuitry to perform a high current and/or a high voltage switching. The circuitry includes a first Gallium Nitride (GaN) on a silicon (Si) substrate lateral field effect transistor. A source terminal of the first GaN lateral field effect transistor on the Si substrate includes an electrical connection to backside of P-type Si substrate through a high voltage isolated resistor that is coupled to a source terminal or a second resistor that is operably coupled to a drain terminal and a substrate terminal. The high voltage isolated resistor and the second resistor cause to a leakage current from the drain terminal to the source terminal via a buffer layer. The leakage current equalizes the voltage drop on the first GaN lateral field effect transistor on the Si substrate to a voltage drop on a serially connected second GaN lateral field effect transistor on the Si substrate.

7 Claims, 9 Drawing Sheets

(51) Int. Cl.
  *H03K 17/687* (2006.01)
  *H03K 3/01* (2006.01)
  *H03K 17/10* (2006.01)
  *H03K 17/14* (2006.01)
  *H03K 7/08* (2006.01)
  *H01L 29/778* (2006.01)
  *H01L 29/10* (2006.01)
  *H01L 29/20* (2006.01)

(52) U.S. Cl.
  CPC ........ *H03K 17/145* (2013.01); *H01L 29/1075* (2013.01); *H01L 29/2003* (2013.01); *H01L 29/7786* (2013.01); *H03K 2217/0018* (2013.01)

(56) References Cited

U.S. PATENT DOCUMENTS

| | | |
|---|---|---|
| 2011/0285481 A1* | 11/2011 | Huang ............... H01P 1/22 333/81 R |
| 2011/0305054 A1 | 12/2011 | Yamagiwa et al. |
| 2012/0086499 A1 | 4/2012 | Husain et al. |
| 2014/0227983 A1 | 8/2014 | Clausen |
| 2014/0374766 A1 | 12/2014 | Bahl et al. |
| 2017/0322881 A1 | 11/2017 | Gschwind et al. |

FOREIGN PATENT DOCUMENTS

| | | |
|---|---|---|
| KR | 20070109016 | 11/2007 |
| WO | WO2015179201 | 11/2015 |

* cited by examiner

POWER DEVICE FOR HIGH VOLTAGE AND HIGH CURRENT SWITCHING

CROSS REFERENCE TO RELATED APPLICATIONS

This application claims the benefit of U.S. Provisional Application No. 62/395,125, filed Sep. 15, 2016, and U.S. Provisional Application No. 62/426,248, filed Nov. 24, 2016, both of which are incorporated by reference in their entireties.

BACKGROUND OF THE INVENTION

Various products and systems, such as televisions, electric-powered vehicles, radar systems, electric motor controllers, and/or uninterrupted power supply systems, may require the provision of a relatively large amount of electrical power, which may be transmitted from a high voltage power supply. Various types of semiconductor field effect transistors (FETs) may be used as power switches to perform switching functions that may be required by the products and/or systems.

BRIEF DESCRIPTION OF THE DRAWINGS

The subject matter regarded as the invention is particularly pointed out and distinctly claimed in the concluding portion of the specification. For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The specification, however, both as to organization and method of operation, together with objects, features, and advantages thereof, may best be understood by reference to the following detailed description when read with the accompanying drawings in which:

DETAILED DESCRIPTION OF THE INVENTION

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one embodiment", "an embodiment", "demonstrative embodiment", "exemplary embodiments", "various embodiments" etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

According to some demonstrative embodiments, semiconductor field effect transistors (PETS) may rely on silicon materials and/or other materials. For example, a FET may include a source terminal and a drain terminal, which may be used for connecting a power source to a load. A further terminal in the FET may be located between the sources and drain terminals, this terminal may be referred to as a gate terminal. The gate terminal may control resistance of a current carrying channel.

During operation, a voltage that may be relative to a common ground may be applied to the gate terminal to, for example, the voltage may generate an electric field in the FET which may act to, for example, control the resistance thereof, and may serve to turn the transistor ON and/or OFF. For example, when the FET is turned ON, the voltage applied to the gate terminal may reduce the resistance in the current carrying channel so as to, for example, allow for relatively large current flow between the source and drain terminals. The total resistance between the source and drain terminals when the FET may be turned ON may be referred to as the ON resistance of the transistor. The ON resistance may depend upon the resistance of the current carrying channel, the resistance to the current flow of a region of the FET under and in the vicinity of the source terminal, and/or the resistance of a region of the FET under and/or in the vicinity of the drain terminal. The respective regions in and around the source and drain terminals may be referred to as access regions of the FET.

Conventional power FETs that are based on silicon (Si) may provide switching functionality to power switching applications, if desired. For example, electric motors and/or vehicles, fast chargers, uninterruptible power supplies and/or photovoltaic inverters and the like.

According to some demonstrative embodiments, nitride based semiconductors, such as, for example Gallium Nitride (GaN) and Aluminum Nitride (AlN), may be characterized as having relatively large band gaps. For example, the band gaps may be ~3.4 eV for GaN and/or ~6.2 eV for MN. For example, FETs which may include a nitride semiconductor layer structure may also include a small band gap layer adjacent to a large band gap layer. Those FETs may have a relatively high concentration of high mobility electrons which may be characterized as having a high saturation drift velocity. The high mobility electrons may accumulate in a narrow triangular potential well at an interface between the layers to form a relatively thin, sheet-like electron concentration, which may be referred to as a two-dimensional electron gas (2DEG). Due to, for example, the geometric construction and/or location of the 2DEG, electrons in the 2DEG may generally exhibit very low donor impurity scattering and, as a result, may have the relatively high electron mobility and/or velocity, on the order of, for example, 1800 cm2/V*s and 1.5×107 cm/s respectively. Concentrations of electrons in a 2DEG may be as high as 1×1013/cm2. As a result of the above, for example, FET transistors may have a very low specific Rds(on).

According to some exemplary embodiments, FET transistors that operate by generating and/or controlling high mobility electrons in 2DEGs can be referred to as high electron mobility transistors. Semiconductor layer structures that can include multiple layers of different composition may be referred to as having heterostructures, and interfaces between two adjacent layers of different composition may be referred to as heterojunctions.

In some embodiments, the technology involves a circuitry of plurality of serial and/or parallel connections of a discrete and/or a monolithic GaN lateral field effect transistor on the Si substrates for enhanced blocking voltage range. The source of the GaN transistor may have an electrical connection to a backside of a p-type Si substrate, for example through a high value and/or a high voltage isolated resistor. The high voltage isolation transistor may have the value of a few Mega Ohms. For example, a vertical leakage current may flow from the source through the buffer layer to a conductive Si substrate and from the conductive Si substrate through the buffer layer to the drain. The vertical leakage current may be viewed as a non-linear resistor and/or as bus voltage dependent. Additionally, a vertical blocking voltage (e.g., source-substrate-drain) may be lower than a lateral blocking voltage and/or vertical substrate-drain leakage current may be higher than a lateral source-drain leakage. GaN on Si transistors may have a current capability of at least of 1 Ampere and/or a blocking voltage of at least 600V.

According to some embodiments, for example, the circuitry may include a voltage dependent resistor of an epitaxial buffer layer grown on a Si substrate and/or the connection of source terminal to the substrate through a high voltage resistor. The circuitry may be applied to devices and system that operate in a high voltage range from a discrete and/or monolithic GaN on Si transistors ranged up to 650V, or, for example, 1200V, 1700V, 3500V or above, if desired.

Figure 1:
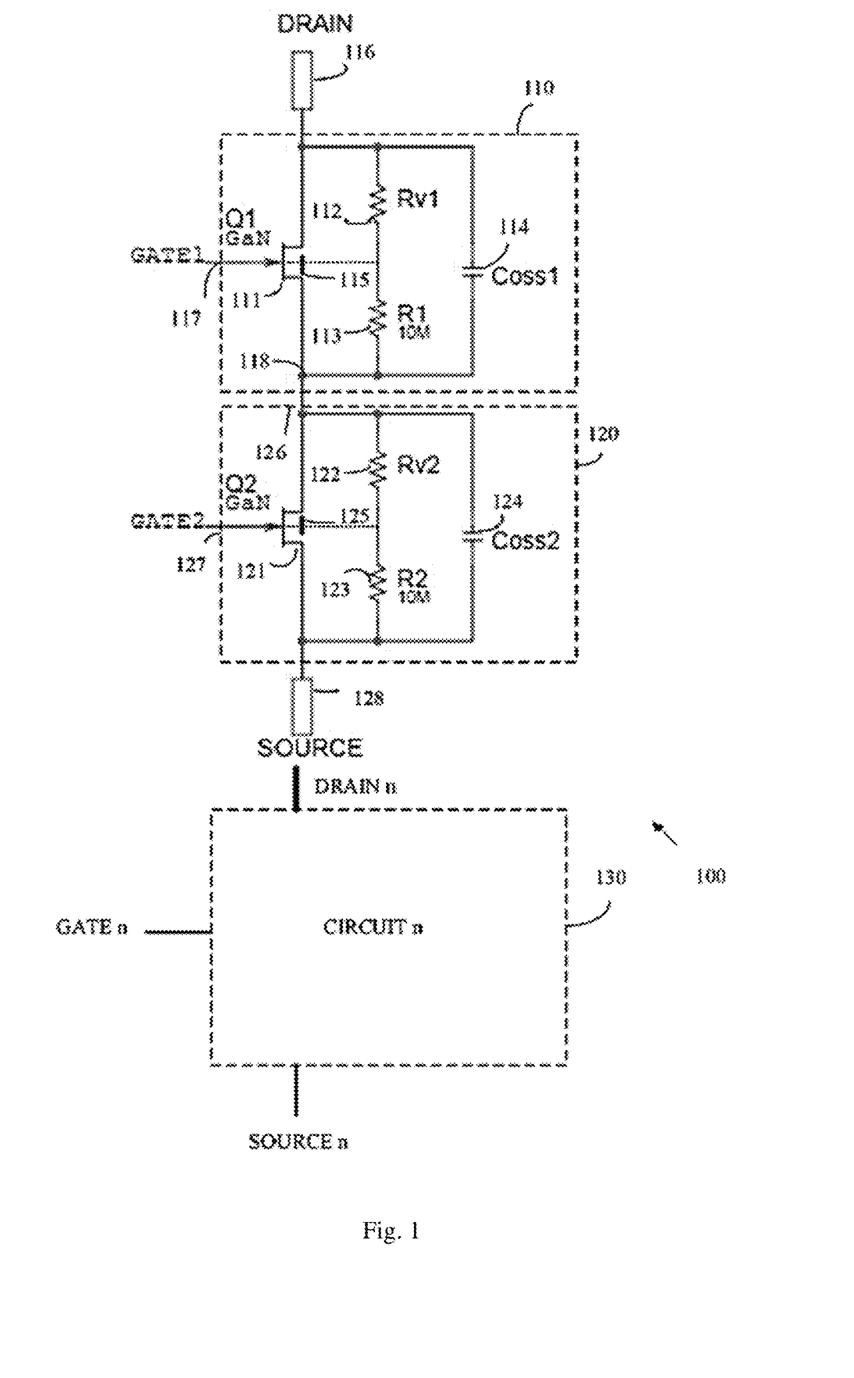
FIG. 1 is a schematic block diagram illustration of a High Voltage power switching circuitry, in accordance with some demonstrative embodiments.

Reference is now made to FIG. 1, which schematically illustrates a power switching circuitry 100 according to some demonstrative embodiments. For example, power switching circuitry 100 may include a "normally off" high power, high voltage switching circuitry. Switching circuit 100 may include a circuit 110, a circuit 120 and n circuits 130. Circuits 110, 120 and 130 may include the same components, if desired.

For example, circuit 110 may include a GaN transistor (Q1) 111, a resistor (Rv1) 112, a resistor (R1) 113 and a capacitor (Coss1) 114. Transistor 111 may include a P-type Si substrate terminal 115, a drain terminal 116, a gate terminal 117 and a source terminal 118. Circuit 120 may include a GaN transistor (Q2) 121, a resistor (Rv2) 122, a resistor (R2) 123, and a capacitor (Coss2) 124. Transistor 121 may include a P-type Si substrate terminal 125, a drain terminal 126, a gate terminal 127 and a source terminal 128. Circuit 130 may have substantially the same components and substantially the same circuit design as circuits 110 and 120.

According to some embodiments of the invention, for example, circuits 110, 120, 130 may be used as a building block in order to achieve higher voltage range. For example, circuits may be repeated and connected in series and/or parallel to achieve various desired voltage levels. For example, a single circuit (e.g., circuit 110) may provide 650 v, two circuits (e.g., circuits 110, 120) connected in series may achieve 1200 v, three circuits (e.g., circuits 110, 120 and 130) connected in series may achieve 1700 v, six circuits connected in series may achieve 3500 v and the like.

According to some demonstrative embodiments, for example transistors 111 and 121, e.g., GaN transistors and resistor 112 may be grown on a silicon (Si) substrate. With some embodiments, for example, the diameter of the Si substrate may be in the range of six to twelve inches, if desired. A buffer layer (not shown) may be applied between the Si substrate and the GaN transistor, e.g., transistor 111. The thickness of the buffer layer may be in the range of one to eight microns. The buffer layer can provide isolation from substrate and/or a match to the high voltage.

According to some demonstrative embodiments, transistors 111,121, e.g., Q1, Q2, may be, for example a "normally on" power GaN transistors connected in series. Resistors 112 (e.g., Rv1) and 122 (e.g., Rv2) are each an internal voltage dependent resistance of the semiconductor structure Drain-Substrate-Source. Capacitors 114 (e.g., Coss1) and 124 (e.g., Coss2) include transistors with internal voltage dependent output capacitances.

According to some demonstrative embodiments, high power switching circuitry 100 may have three modes of operation. For example, the first mode may be an "off" state. With some embodiments, the "off" state may be referred as static mode. In the "off" state mode, both transistors 111 and 121 may be in "off" condition, if desired. In the second mode, e.g., transient state mode, transistors 111 and 121 may be in transient states. Transient state may occur when transistors, e.g., transistors 111 and 121, may be switched from "off" state to "on" state and vice versa. In some embodiments, the third mode may be a conducting state mode. For example, in the conducting state mode, transistors 111 and 121 may be in "on" state. In all the above states, voltage across transistor 111 and/or transistor 121 may be divided substantially equally between transistors 111 and 121 according to a self-balancing characteristic that is embedded in this example circuit design, although it should be understood that other circuit designs may be used with other embodiments of the technology. Furthermore, high power switching circuitry 100 may be able to switch at minimum frequency of 2 kHz with blocking voltage of at least 600V, if desired.

According to some embodiments, for example, resistor (Rv1) 112 and capacitor (Coss1) 114 may be part of a physical structure of transistor (Q1) 111. Resistor (Rv2) 122 and capacitor (Coss2) 124 may be part of a physical structure of transistor (Q2) 121. For example, resistors 112 and 122 may be in the range of 1 kOhm to 100 MOhm, and capacitors 114 and 124 may be in the range of 10 pF to 1 nF. Resistor (R1) 113 and resistor (R2) 123 may be in the range of 0 Ohm to 100 MOhm.

In one example embodiment, the value of resistors 113 and 123 may be 10 MOhm. In an event of a voltage incline and/or voltage decline on a drain of transistors 111 and 121, for example, an un-initial voltage spike, resistors 112 and 122 may be involved together with capacitors 114, 124 and resistors 113, 123 in balancing substantially equally the voltage drop on transistors 111 and 121.

Figure 2:
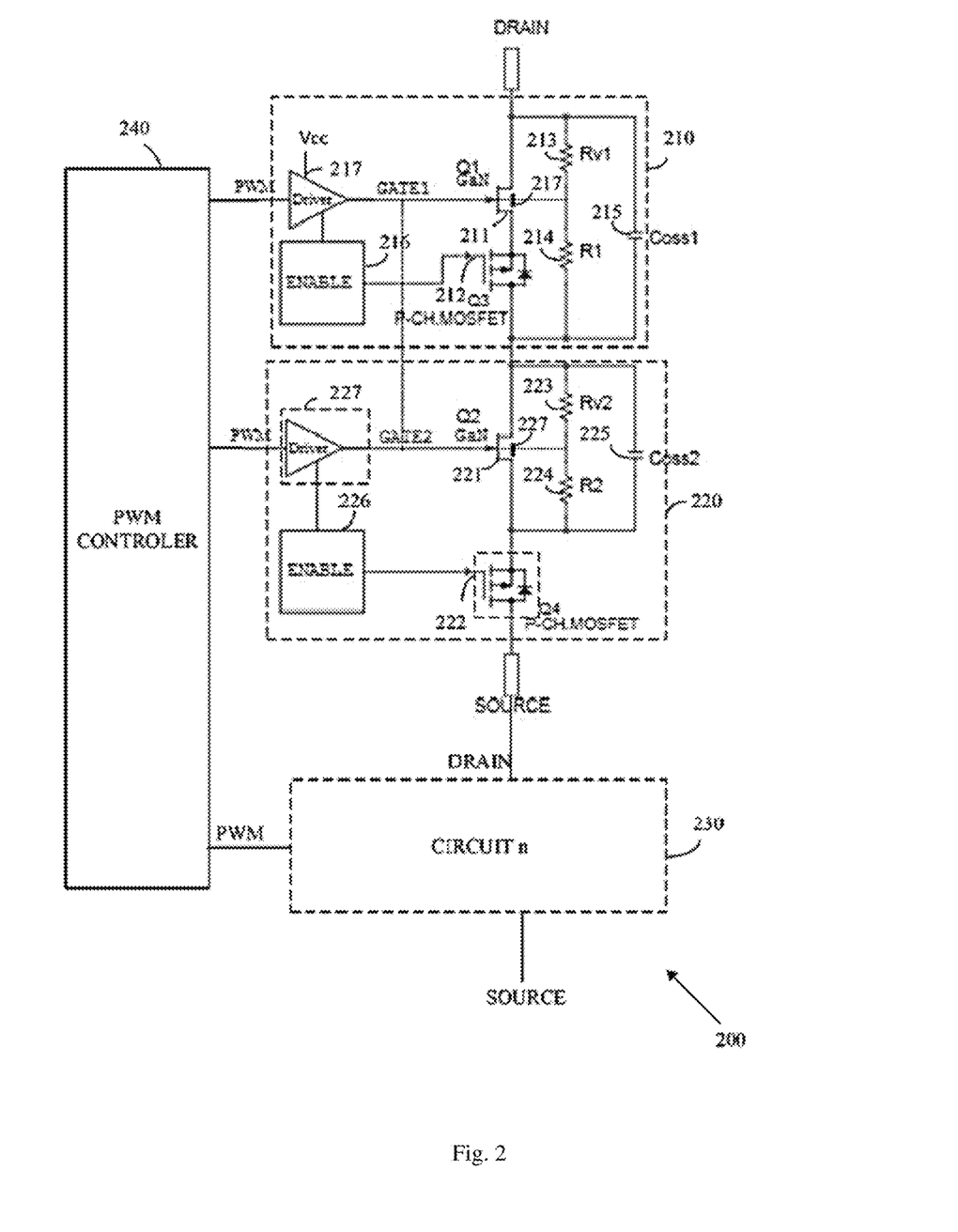
FIG. 2 is a schematic illustration of a power switching circuitry, in accordance with some demonstrative embodiments.

Reference is now made to FIG. 2, which schematically illustrates a power switching circuitry 200, in accordance with some demonstrative embodiments. The operation of circuitry 200 is similar to that of circuitry 100 with the addition of two functions. First function is the Vcc absence protection circuit comprising enable units 216, 226. The second function is the PWM controller 240, which controls the operation of all units 210, 220 and 230n. For example, power switching circuitry 200 may include a high voltage, high power switching circuitry. Switching circuitry 200 may include a circuit 210, a circuit 220, n circuits 230 and a pulse width modulation (PWM) controller 240. Circuits 210, 220 and 230 may have substantially the same circuit design and may include the same components. In some embodiments, a common circuit of circuits 220 and/or 230 may not include separate driver and/or separate Si MOSFET transistor, if desired.

For example, circuit 210 may include a GaN transistor (Q1) 211 in serial connected to P-channel Metal-Oxide Semiconductor Field-Effect transistor (MOSFET) (Q3) 212, a resistor (Rv1) 213, a resistor (R1) 214, a capacitor (Coss1) 215, an enable circuit 216 and a driver circuit 217. Transistor 211 may include a P-type Si substrate terminal 217. Circuit 220 may include a GaN transistor (Q2) 221, P-channel MOSFET transistor (Q4) 222, a resistor (Rv2) 223, a resistor (R2) 224, a capacitor (Coss2) 225, an enable circuit 226 and a driver circuit 227. Transistor 211 may include a P-type Si substrate terminal 227.

According to one exemplary embodiment, circuit 230 may have substantially the same circuit design and components as circuits 210 and 220. According to another exemplary embodiment, circuit 220 may not include driver 227 and transistor Q4 222. In this embodiment, driver 217 may be connected to a gate of transistor Q2 221 shown by a dotted line, if desired. It should be understood that other designs of circuit 220 with embodiments of the invention are possible.

According to some embodiments of the invention, for example, circuits 210, 220, 230 may be used as a building block in order to achieve higher voltage range. For example, a single circuit (e.g., circuit 210) may provide 650 v, two circuits (e.g., circuits 210, 220) connected in series may achieve 1200 v, three circuits (e.g., circuits 210, 220 and 230) connected in series may achieve 1700 v, six circuits connected in series may achieve 3500 v, etc.

According to some demonstrative embodiments, for example, transistors Q1 211 and Q2 221 may include "normally on" power GaN transistors connected in series. Transistors Q3 212 and Q4 222 may include a high current Si MOSFET N and/or P Channel transistors. Transistors Q3 212 and Q4 222 may provide common current interruption during power-up, power-down and Vcc under voltage, and/or in case of abnormal operation. During continuous normal operation, transistors Q3 212 and Q4 222 may be continuously conductive by enable circuitry 226 and thereby may be 'transparent' to the power-on / power-off regular switching mode.

Enable circuitries 216 and 226 may provide control on voltage levels of gates of transistors 212 and 222 and may activate and/or deactivate drivers 217, 227 to permit a PWM signal flow to GaN transistor gates, e.g., the gates of transistors 211, 221. Enable circuitries 216, 226 may also provide a predetermined sequence of switching activation and may protect transistors 211, 212, 221 and 222 from transients during a system power supply turn on/turn off operations, as explained above.

According to some demonstrative embodiments, for example, a driver e.g., driver 227 may not include an under-voltage lockout function. According to this example, if Vcc is lower than a predetermined threshold, enable circuits 216 and 226 may cut off transistors Q3 212 and Q4 222 and may cut off gate control of transistors Q1 211 and Q2 221, and device 200 may turn to an "off" mode. The term cut-off can be used to describe that a transistor may act like an open circuit, wherein for example, no current flows from drain to source and/or no signal is provided to the gate.

According to some exemplary embodiments, PWM controller 240 may be connected to drivers 217 and 227. For example, PWM controller 240 may drive transistors 211 and 221 substantially simultaneously, if desired.

According to some demonstrative embodiments, resistor (Rv1) 213 and capacitor (Coss 1) 215 are built in the physical structure of transistor (Q1) 211. Resistor (Rv2) 223 and capacitor (Coss2) 225 are built in the physical structure of transistor (Q2) 221. For example, resistors 213 and 223 may be in the range of 1 kOhm (Kilo-Ohm) to 100 MOhm (Mega-Ohm), and capacitors 215 and 225 may be in the range of 10 pF (Picofarad) to 1 nF (Nanofarad). Resistor (R1) 214 and resistor (R2) 224 may be in the range of 0 Ohm to 100 MOhm. In an event of a voltage increase and/or voltage decrease on a drain of transistors 211 and 221, for example, an un-initial voltage spike, resistors 213 and 223 may be involved together with capacitors 215, 225, resistors 214, 224, and transistors 212 and 224 in balancing substantially equally the voltage drop on transistors 111 and 121.

According to some demonstrative embodiments, for example a serial connection of a plurality of discrete and/or monolithic GaN lateral field effect transistors on the Si substrates may result in a total output capacitance (Coss) of Coss total=Coss1/N, wherein Coss1 is the output capacitance of the discrete and/or monolithic GaN lateral field effect transistor on the Si substrate, and N is the number of the serial connected discrete and/or monolithic GaN lateral field effect transistors on the Si substrates.

Figure 3:
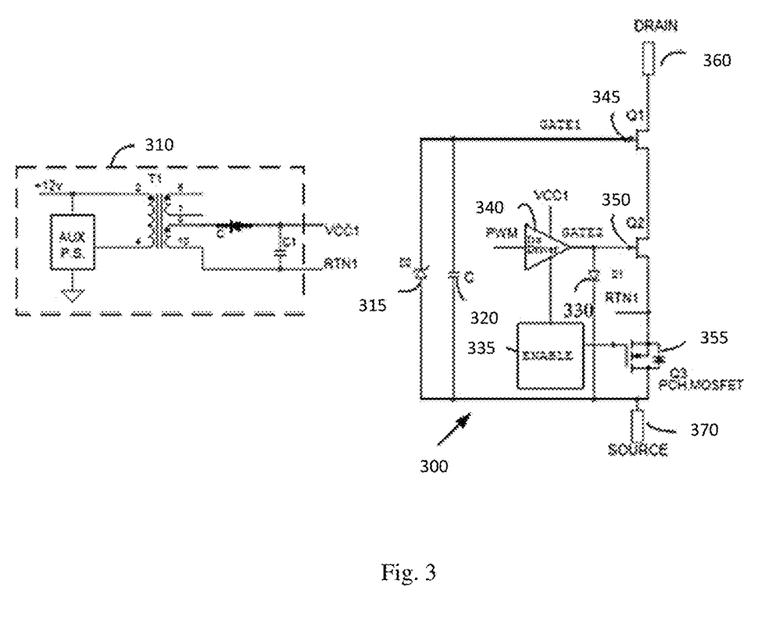
FIG. 3 is a schematic illustration of a power switching circuitry with a common power supply, in accordance with some demonstrative embodiments.

Reference is now made to FIG. 3, which schematically illustrates a power switching circuitry 300 with a single power supply (PS) 310, in accordance with some demonstrative embodiments. According to some embodiments, the power switching circuitry may include a high voltage power switching circuitry. Power switching circuitry 300 may include, for example, a Zener diode (D2) 315, a capacitor (C), a diode (D1) 330, an enable circuit 335, a driver 340, a GaN transistor (Q1) 345, a GaN transistor (Q2) 350, a MOSFET transistor 355, a drain terminal 360 and a source terminal 370.

In operation, according to this example embodiment, PS 310 may provide VCC1 to driver 340, enable circuit 335 and RTN1 to a source of GaN transistor Q2 350 and to a drain of transistor Q3 355 (e.g., the source of GaN transistor Q2 350 is connected to the source of transistor Q3 355). For example, the voltage range of VCC1 may be −8V to −15V.

According to some embodiments, when transistor Q2 350 may turn to OFF condition, its drain voltage may be raised together with a source voltage of transistor Q1 345. After reaching a positive voltage that may be above the gate threshold voltage of transistor Q1 345, transistor Q1 345 may turn to OFF condition. For example, the gate threshold voltage of transistor Q1 345 may be in the range of −6V to −15V. When transistor Q2 350 (e.g., a GaN transistor) may transition to OFF condition, transistor Q1 345 may lag in transition period because a gate of transistor Q1 345 may be connected to ground potential via capacitor C 320. For example, the lag period may be 0.5 ns to 10 ns.

According to some embodiments, for example, a voltage rise of transistor Q2 350 (e.g., GaN transistor) may be limited to 400V by Zener diode D2 315. Zener diode D2 315 may be rated according to the breakdown voltage of transistor Q1 345. For example, the breakdown voltage of transistor Q1 345 may be 650V.

According to some example embodiments, when applying Drain Source voltage to transistors Q1 345 and Q3 355 while VCC1 is absent may turn GaN transistor Q2 350 to OFF condition. A DC balancing may be achieved, when Gate-Source voltage of "normally On" transistors, e.g., Q1345 and Q2 350, may become equal to their threshold voltages, due to diodes D2 315 and D1 330. For example, the threshold voltage may be −6V to −15V.

According to some embodiments, when applying VCC1, it may turn ON enable circuit 335. For example, enable circuit 335 may turn to ON or OFF transistor 355 according to a VCC1 voltage that may be provided by power supply 310, although it should be understood that this example is not limited to the circuitry of FIG. 3.

Figure 4:
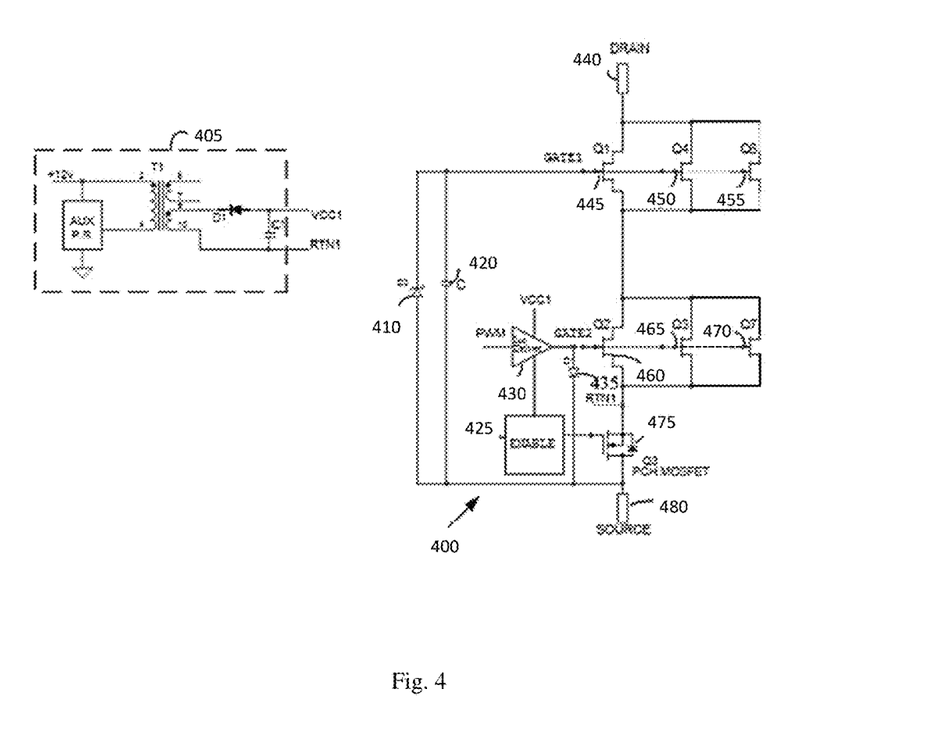
FIG. 4 is a schematic illustration of a power switching circuitry with a single isolated power supply, in accordance with some demonstrative embodiments.

Reference is now made to FIG. 4 which schematically illustrates a power switching circuitry 400 with a single power supply (PS) 405, in accordance with some demonstrative embodiments. According to some embodiments, power switching circuitry 400 may include a high voltage power switching circuitry. Power switching circuitry 200 may include for example, a Zener diode (D2) 410, a capacitor (C) 420, an enable circuit 425, a driver 430, a diode (D1) 435, GaN transistors Q1445, Q4 450, Q6 455, GaN transistors Q2 460, Q5 465, Q7 470, a MOSFET transistor 475, a drain terminal 440 and a source terminal 480.

In operation, according to this example embodiment, PS 405 may provide VCC1 to driver 430 and RTN1 to a common source of GaN transistors Q2 460, Q5 465 . . . Q7 470 and to a drain of transistor Q3 475 (e.g., the common source of GaN transistors Q2 460, Q5 465 . . . Q7 470 is connected to the drain of transistor Q3 475). For example, the voltage range of VCC1 may be −8V to −15V.

According to some embodiments, when GaN transistors Q2 460, Q5 465 . . . Q7 470 may turn to OFF condition, their drain voltage may be raised together with a source voltage of GaN transistors Q1 445, Q4 450 . . . Q6 455. The voltage may rise until reaching a positive voltage for example, 400V. After reaching the positive voltage that may be above the gate threshold voltage of GaN transistors Q1 445, Q4 450 . . . Q6 455, GaN transistors Q1 445, Q4 450 . . . Q6 455 may turn to OFF condition. For example, the gate threshold voltage of GaN transistors Q1 445, Q4 450 . . . Q6 455 may be in the range of −6V to −15V. When GaN transistors Q1 445, Q4 450 . . . Q6 455 may transition to OFF condition, GaN transistors Q1 445, Q4 450 . . . Q6 455 may lag in transition period because gates of GaN transistor Q1 445, Q4 450 and Q6 455 may be connected to ground potential via capacitor C 420. For example, the leg period may be 0.5 ns to 10 ns.

According to some embodiments, for example, a voltage rise of GaN transistors Q2 460, Q5 465 . . . Q7 470 may be limited to 400V by Zener diode D2 410. Zener diode D2 410 may be rated in according to the breakdown voltage of GaN transistors Q1445, Q4 450 . . . Q6 455. For example, the breakdown voltage of GaN transistors Q1 445, Q4 450 . . . Q6 455 may be 650V.

According to some example embodiments, applying Drain Source voltage to GaN transistors Q1445, Q4 450 . . . Q6 455 and GaN transistors Q2 460, Q5 465 . . . Q7 470 while VCC1 is absent may turn MOSFET transistor Q3 475 to OFF condition. A DC balancing may be achieved, when Gate-Source voltage of normally On GaN transistors, e.g., Q1 445, Q4 450 . . . Q6 455 and GaN transistors Q2 460, Q5 465 . . . Q7 470 may become equal to their threshold voltages, due to diodes D2 410 and D1 435. For example, the threshold voltage may be −6V to −15V.

According to some embodiments, when applying VCC1, it may turn ON enable circuit 425. For example, enable circuit 425 may turn to ON and/or OFF MOSFET transistor 475 according to a VCC1 voltage that may be provided by PS 405, although it shout be understood that this example is not limited to the circuitry of FIG. 4.

Advantageously, by paralleling GaN transistors as illustrated in FIG. 4, in accordance with some demonstrative embodiments, higher Drain 440 Source 480 Currents and lower On State Resistances of combined GaN transistors Q1 445, Q2 450 . . . Q6 455 and GaN transistors Q2 460, Q5 465 . . . Q7 470 may be achieved. This example configuration may allow to achieve both higher voltages and/or higher currents at substantially the same time while decreasing conduction losses.

Figure 5A:
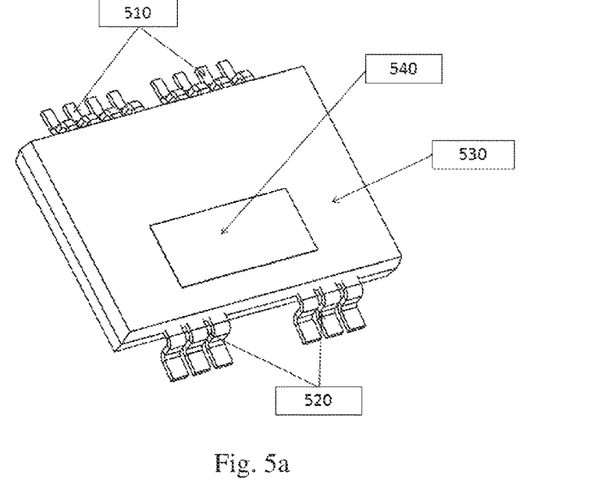
FIG. 5*a* is a schematic illustration of a top view of a high power switching device, in accordance with some demonstrative embodiments.

Reference is now made to FIG. 5*a*, which schematically illustrates a top view of a high-power switching device 500, in accordance with some demonstrative embodiments. For example, high power switching device 500 may include low current leads 510, high current leads 520, a molding compound 530 and/or an exposed thermal interface pad 540. For example, a heat sink for cooling the power transistors of high power switching device 500, may be attached to exposed thermal interface pad 540, if desired.

Figure 5B:
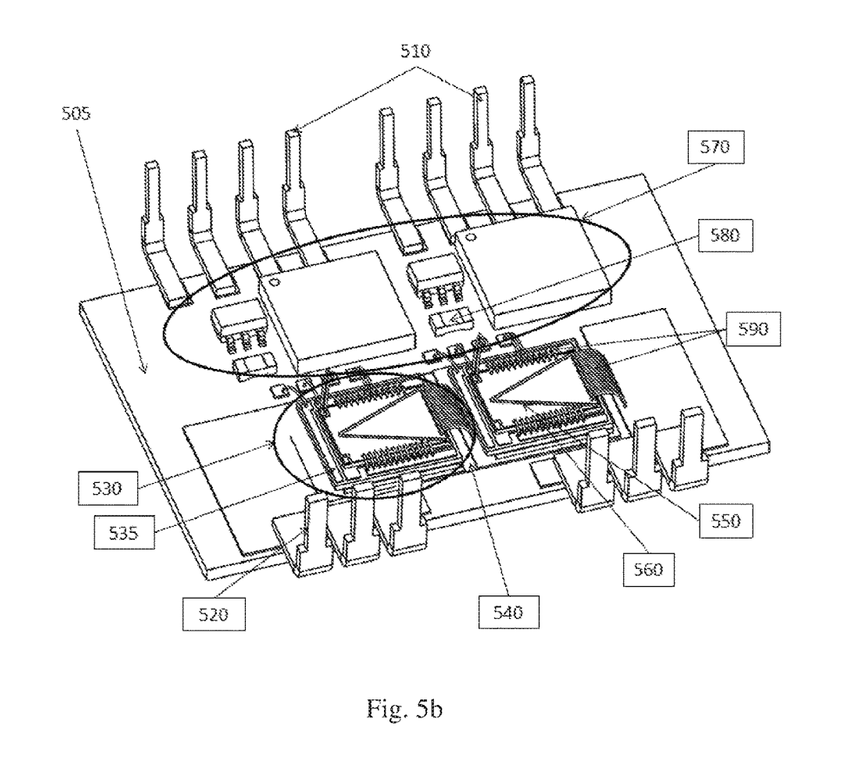
FIG. 5*b* is a schematic illustration of a top view of a high power switching device, in accordance with some demonstrative embodiments.

Reference is now made to FIG. 5*b*, which schematically illustrates a bottom view of a high-power switching device 500, in accordance with some demonstrative embodiments. For example, high power switching device 500 may include low current leads 510, high current lead 520, a 3 dimensional (3D) power die stack 530, a ceramic interposer 535, an embedded ceramic insert 540, a GaN on Si FET 550, a Si MOSFET 560, an enable circuitry 570, a high voltage (HV) resistor 580 and/or small diameter bond wires 590.

According to some demonstrative embodiments, for example, the circuitry of FIG. 1, 2, 3 or the circuitry of FIG. 4 may be implemented on high power device 500. Low current leads 510 may be used to provide input signals and/or voltage to drivers 217 and 227. High current leads 520 may provide a high voltage to transistor 211 drain and ground potential to transistor 222 source, if desired.

Furthermore, for example, 3D power die stack 530 may include ceramic interposer 535 for providing isolation and heat transfer from GaN on Si FET 550 through ceramic interposer 535, Si MOSFET 560, to top thermal pad 540 and a heat sink (not shown). Ceramic insert 540 may have a high thermal conductivity. Enable circuitry 570 may include for example, HV resistor 580 which may be used for GaN FET leakage reduction.

According to some demonstrative embodiments, high power switching device 500 may be embedded in a high voltage package which may include a printed circuit board (PCB) 505 comprising, for example, an embedded ceramic insert. PCB 505 may include a plurality of conductors which may extend continuously from PCB 505 on ceramic insert 540. A plurality of high current 520 and/or low current 510 metal leads may be attached on PCB 505 by electrically conductive media with a melting point above lead free solder melting point and under 350 degree Celsius (deg C). For example, the high voltage package may be covered by molding compound 430.

According to some exemplary embodiments, 3D power dies stack 530 may include GaN on Si power FET die 550, Si power MOSFET die 560, and/or ceramic interposer 535 with, for example, a plurality of conductors and electrically conducting vias. Ceramic interposer 535 may include a plurality of wire bond pads for an inner and/or an outer wire interconnection. GaN on Si die 550, Si MOSFET die 560 and/or ceramic interposer 435 may be attached by any electrically conductive media with, for example, a melting point above solder melting point and/or under 550 deg C. The high voltage package may also include a plurality of small diameter wire bonds on GaN on Si FET die 550 and Si MOSFET die 560 for a low stray inductance and/or high temperature cycling reliability.

Figure 6:
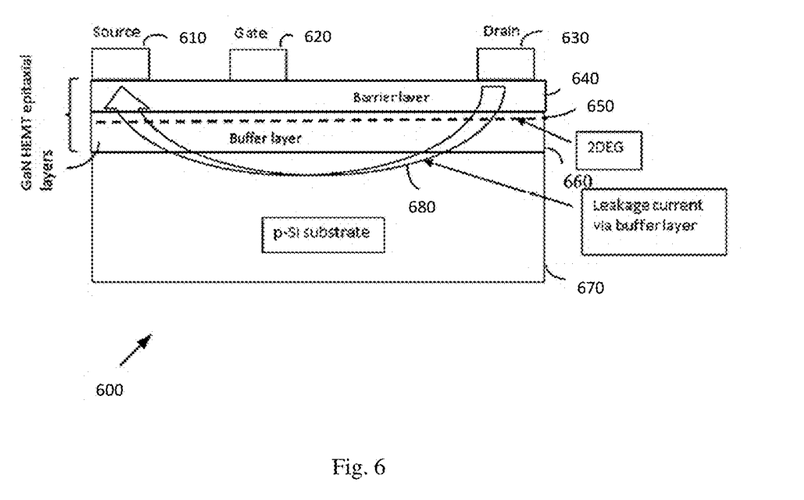
FIG. 6 is a schematic illustration of a physical structure of a GaN transistor in accordance with some demonstrative embodiments.

Reference is now made to FIG. 6, which is a schematic illustration of a physical structure of a GaN transistor 600, in accordance with some demonstrative embodiments. According to some demonstrative embodiments, GaN transistor 600 may include a source terminal 610, a gate terminal 620 a drain terminal 630, a barrier layer 640, a 2DEG 650, a buffer layer 660, a P-Channel Si substrate 670 and/or a leakage current 680.

According to this example embodiment, a vertical leakage current 680 may flow from drain terminal 630 through barrier layer 640, 2DEG 650, buffer layer 660 to conductive Si substrate 670 and/or from conductive Si substrate 670 through buffer layer 660, 2DEG 650, barrier layer 640 to the source terminal 610. Vertical leakage current 480 may behave as a non-linear resistor and/or as a bus voltage dependent resistor.

Additionally, a vertical blocking voltage on source terminal 610, P-channel substrate 670 and drain terminal may be lower than a lateral blocking voltage and/or vertical substrate-drain leakage current and may be higher than a lateral source-drain leakage. GaN on Si transistors may have a current capability of an at least of 1 Ampere and a blocking voltage of an at least 600V, if desired.

Figure 7:
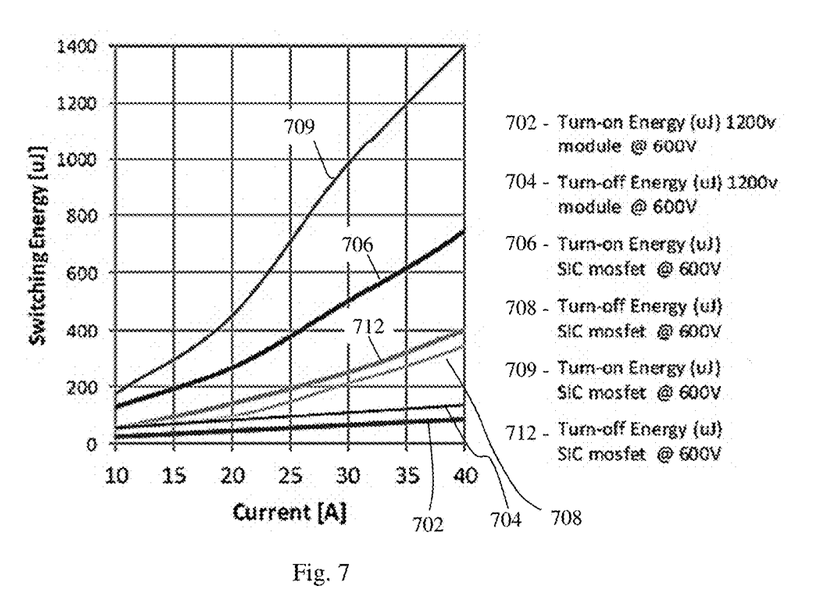
FIG. 7 is a schematic illustration of a Turn-on and Turn-off energy loss graph of a plurality of high power devices, according to some demonstrative embodiments.

Reference is made to FIG. 7, which schematically illustrates a turn on and/or turn off energy loss graphs of a plurality of high power devices, in accordance with some demonstrative embodiments. An example of the performance turn-on energy and/or the turn-off energy of an embodiment of high power switching device 300 is shown by the low lines. Advantageously, for example, for a current from 10 Ampere (A) to 40 A the turn-on energy range can be from 25 uJ to 100 uJ and the turn-off energy range can be from 75 uJ to 100 uJ. In comparison to other prior art switching devices, the current embodiment can perform with lower turn-on, turn-off energy losses.

Figure 8:
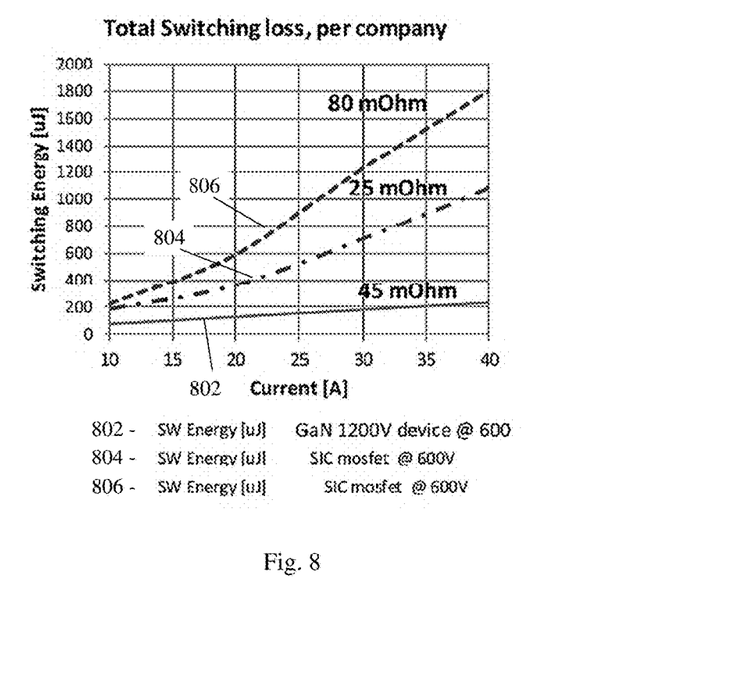
FIG. 8 is a schematic illustration of a switching loss energy graphs of a plurality of high power switching device, in accordance with some demonstrative embodiments.

Reference is made to FIG. 8, which schematically illustrates switching loss energy graphs of a plurality of high power switching device, according to some demonstrative embodiments. The total switching loss of an embodiment of high power switching device 300 is shown by the low line depicted as 45 mOhm. Advantageously, for example, for a current from 10 A to 40 A switching energy range is from 25 uJ to 200 uJ. In comparison to other prior art switching devices, the current embodiment can provide a low switching energy loss.

Figure 9:
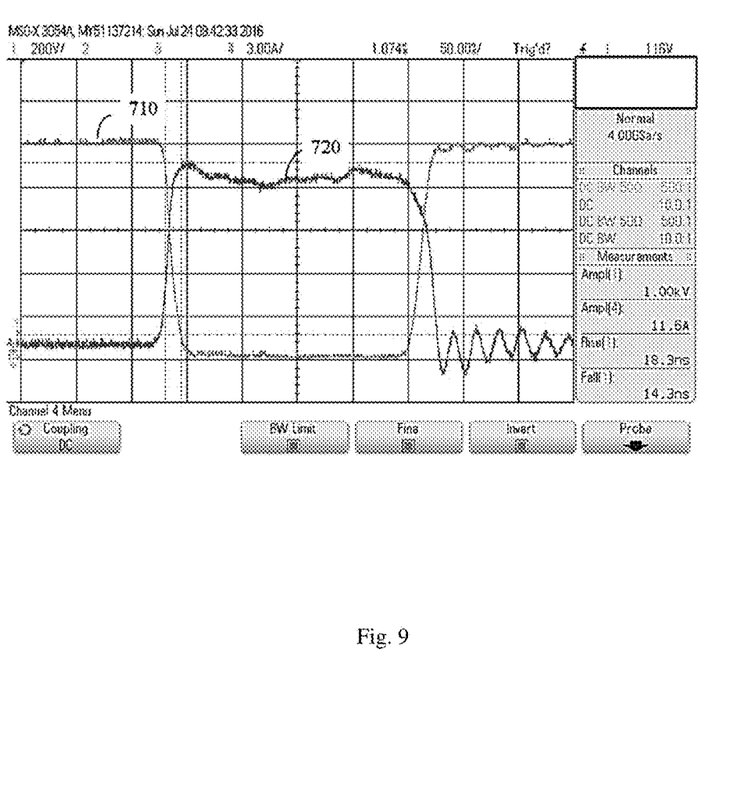
FIG. 9 is a schematic illustration of a wave forms diagram of a voltage and current switching time wave form of a high power switching device, in accordance with some demonstrative embodiments.

Reference is now made to FIG. 9, which schematic illustrates of a voltage and current switching time wave form of a high power switching device, in accordance with some demonstrative embodiments. For example, a first waveform is a voltage waveform 710, and the second waveform is a current waveform 720. Voltage waveform 710 is shown switching of 1 kV voltage with rise time of 18.3 ns and fall time of 14.3 ns which can be better than the current state of the art. Current waveform 620 shows switching of 11.6 A with similar rise and fall times as voltage waveform 610. Current and voltage 610 and 620 waveform shows a continuous straight line during switching times, which prove voltage equalizing and/or synchronized operation between the serial connected GaN on Si FET transistors.

Figure 10:
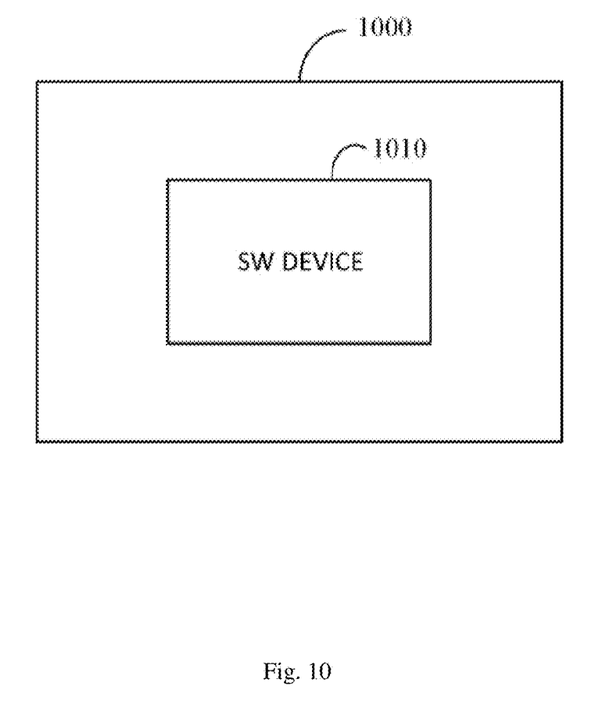
FIG. 10 is a schematic illustration of a block diagram of a system which includes a high voltage a high current switching device, according to some demonstrative embodiments.

Reference is made to FIG. 10 which illustrates a block diagram of a system 1000 which includes a high voltage a high current switching device 1010, according to some demonstrative embodiments. For example, system 1000 may include a switching power supply, e.g., AC to DC power supply, three phase motor drives, solar inverters, uninterrupted power supplies, buttery chargers, high voltage few kV converters and inverters, etc.

According to some example embodiments, a high voltage and/or a high current switching device 1010 may include the circuitry and devices described above in FIGS. 1, 2, 3, 4, 5a and 5b, although it should be understood that FIGS. 1, 2, 3, 4, 5a and 5b are non-limiting example embodiments and other embodiments may be used, if desired.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

EXAMPLES

The following examples pertain to further embodiments.

Example 1 includes an apparatus comprising a circuitry, wherein the circuitry comprises: a first Gallium Nitride (GaN) lateral field effect transistor on a silicon (Si) substrate, wherein a source terminal of the first GaN lateral field effect transistor on the Si substrate comprises an electrical connection to a P-type Si substrate terminal through a first resistor; and a second resistor operably coupled to a drain terminal of the first GaN lateral field effect transistor and to the P-type Si substrate terminal, wherein when a voltage dropped on the first GaN lateral field effect transistor, a first leakage current from the drain terminal to the source terminal via a buffer layer is to equalize of a voltage on the first GaN lateral field effect transistor on the Si substrate to the voltage of a serial connected second GaN lateral field effect transistor on the Si substrate, the buffer layer is epitaxial grown on Si substrate and a conductive substrate.

Example 2 includes the subject matter of Example 1 and optionally, wherein the first GaN lateral field effect transistor on the Si substrate comprises a first discrete GaN lateral field effect transistor on the Si substrate and the second GaN lateral field effect transistor on the a Si substrate comprises a second discrete GaN lateral field effect transistor the a Si substrate.

Example 3 includes the subject matter of Example 1 and Example 2 and optionally, wherein the first GaN lateral field effect transistor on the Si substrate and the second GaN lateral field effect transistor on the Si substrate are monolithically integrated the Si substrate.

Example 4 includes the subject matter of Examples 1 to 3, and optionally, wherein the circuitry comprises: a third resistor operably coupled to a drain terminal and a P-type Si substrate terminal of the second GaN lateral field effect transistor, wherein a leakage current from the drain terminal to a source terminal of the second GaN lateral field effect transistor via a buffer layer is to equalize a voltage drop on the second GaN lateral field effect transistor to the voltage of a serial connected the first GaN lateral field effect transistor, the buffer layer is epitaxially grown on Si substrate and a conductive substrate.

Example 5 includes the subject matter of Examples 1 to 4, wherein the circuitry comprises: a first driver to provide a switch signal the first GaN lateral field effect transistor, a second driver to provide s switch signal to the second GaN lateral field effect transistor, a first Si Metal-Oxide Semiconductor Field-Effect transistor (MOSFET) transistor in serial connected to the first GaN lateral field effect transistor and the second Si MOSFET transistor in serial connected to the second GaN lateral field effect transistor, wherein the first and the second Si MOSFETs are to provide common current interruption when one of the first driver and the second driver are not enabled.

Example 6 includes the subject matter of Examples 1 to 5, and optionally, wherein the circuitry comprises: a first enable circuit operably connected to a gate of the first Si MOSFET and to the first driver which is operably connected to a gate of the first GaN lateral field effect transistor; and a second enable circuit operably connected to a gate of the second Si MOSFET the second driver which is operably connected to a gate of the second GaN lateral field effect transistor, wherein the first and the second enable circuits are to open the first and the second Si MOSFETs for current flow.

Example 7 includes the subject matter of Examples 1 to 6, and optionally, wherein the circuitry comprises: a pulse width modulation (PWM) controller operably connected to the first driver and to the second driver to drive substantially simultaneously the first and the second GaN lateral field effect transistors.

Example 8 includes the subject matter of Examples 1 to 7, and optionally, wherein the first and the second enable circuits are to provide turn-on and turn-off timing sequence of the apparatus and to enable a PWM signal distribution from the PWM controller.

Example 9 includes the subject matter of Examples 1 to 8, and optionally, the apparatus comprising a high voltage and a high current switching device.

Example 10 includes the subject matter of Examples 1 to 9, and optionally, the apparatus is to switch the first and the second GaN lateral field effect transistor at a minimum frequency of 1 Kilo Hertz and a blocking voltage of at least 600 Volts.

Example 11 includes the subject matter of Examples 1 to 10, and optionally, wherein a serial connection of a plurality of GaN lateral field effect transistor results in total output capacitance (Coss) of Coss total =Coss1/N, wherein Coss1 is the output capacitance of the first GaN lateral field effect transistor on the Si substrate, and N is the number of the serial connected GaN lateral field effect transistors on the Si substrates.

Example 12 includes the subject matter of Examples 1 to 11, and optionally, wherein the first and second GaN lateral field effect are normally off type transistors.

Example 13 includes a system comprising an apparatus for a high voltage a high current switching, the apparatus comprises: a first Gallium Nitride (GaN) lateral field effect transistor on a silicon (Si) substrate, wherein a source terminal of the first GaN lateral field effect transistor on the Si substrate comprises an electrical connection to a P-type Si substrate terminal through a first resistor; and a second resistor operably coupled to a drain terminal of the first GaN lateral field effect transistor and to the P-type Si substrate terminal, wherein when a voltage dropped on the first GaN lateral field effect transistor, a first leakage current from the drain terminal to the source terminal via a buffer layer is to equalize a voltage on the first GaN lateral field effect transistor on the Si substrate to the voltage of a serial connected second GaN lateral field effect transistor on the Si substrate, the buffer layer is epitaxial grown on Si substrate and a conductive substrate.

Example 14 includes the subject matter of Example 13 and optionally, wherein the first GaN lateral field effect transistor on the Si substrate comprises a first discrete GaN lateral field effect transistor on the Si substrate, and the second GaN lateral field effect transistor on a Si substrate comprises a second discrete GaN lateral field effect transistor the a Si substrate.

Example 15 includes the subject matter of Example 13 and Example 14, and optionally, wherein the first GaN lateral field effect transistor on the Si substrate and the second GaN lateral field effect transistor on the Si substrate are monolithically integrated on a Si substrate.

Example 16 includes the subject matter of Examples 13 to 15, and optionally, wherein the apparatus comprises: a third resistor operably coupled to a drain terminal and a backside of a P-type substrate terminal of the second GaN lateral field effect transistor on the Si substrate, wherein, when a voltage dropped on the first GaN lateral field effect transistor, a leakage current from the drain terminal to a source terminal of the second GaN lateral field effect transistor via a buffer layer is to equalize a voltage on the second GaN lateral field effect transistor on the Si substrate to the voltage of a serial connected the first GaN lateral field effect transistor on the Si substrate, the buffer layer is epitaxial grown on the Si substrate and a conductive substrate.

Example 17 includes the subject matter of Examples 13 to 16, and optionally, wherein the apparatus comprises: a first driver to provide a switch signal the first GaN lateral field effect transistor on the Si substrate; a second driver to provide s switch signal to the second GaN lateral field effect transistor; a first Si Metal-Oxide Semiconductor Field-Effect transistor (MOSFET) transistor in serial connected to the first GaN lateral field effect transistor; and the second Si MOSFET transistor in serial connected to the second GaN lateral field effect transistor, wherein the first and the second Si MOSFETs are to provide common current interruption when a one driver of the first driver and the second driver are not enabled.

Example 18 includes the subject matter of Examples 13 to 17, and optionally, wherein the apparatus comprises: a first enable circuit operably connected to a gate terminal of the first Si MOSFET and to the first driver which is operably connected to a gate terminal of the first GaN lateral field effect transistor; and a second enable circuit operably connected to a gate of the second Si MOSFET the second driver which is operably connected to a gate terminal of the second GaN lateral field effect transistor, wherein the first and second enable circuits are to activate the first and the second Si MOSFETs for a current flow.

Example 19 includes the subject matter of Examples 13 to 18, and optionally, wherein the apparatus comprises: a pulse width modulation (PWM) controller operably connected to the first driver and to the second driver to drive substantially simultaneously the first and the second GaN lateral field effect transistors.

Example 20 includes the subject matter of Examples 13 to 19, and optionally, wherein the first and the second enable circuits are to provide turn-on and turn-off timing sequence of the apparatus and to enable a PWM signal distribution from the PWM controller.

Example 21 includes the subject matter of Examples 13 to 20, and optionally, wherein the apparatus comprises a high voltage and a high current switching power supply.

Example 22 includes the subject matter of Examples 13 to 21, and optionally, wherein the apparatus is configured to switch the first and the second GaN lateral field effect transistor at a minimum frequency of 1 Kilo Hertz and a blocking voltage of at least 600 Volts.

Example 23 includes the subject matter of examples 13 to 22, and optionally, wherein a serial connection of a plurality of GaN lateral field effect transistor results in a total output capacitance (Coss) of Coss total=Coss1/N, wherein Coss1 is the output capacitance of the first GaN lateral field effect transistor, and N is the number of the serial connected GaN lateral field effect transistors.

Example 24 includes the subject matter of Examples 13 to 23, wherein the first and second GaN lateral field effect transistor are normally off type transistors.

Example 24 includes an apparatus comprising: a high voltage package with a printed circuit board (PCB), the PCB comprises an embedded ceramic insert, a 3D power dies stack, the 3D power dies stack comprises a GaN transistor on Si power FET die, a power Si MOSFET die, a ceramic interposer with plurality of conductors and electrically conducting vias, wherein the GaN transistor on Si power FET die, the Si MOSFET and the ceramic interposer are attached by an electrically conductive media with a melting point above a solder melting point.

Example 25 includes the subject matter of Example 24, and optionally, wherein the ceramic interposer comprises a plurality of wire bond pads for an inner and an outer wire interconnection, a plurality of conductors extended continuously from the PCB and a plurality of a high current and a low current metal leads attached to the PCB by electrically conductive media with a melting point above a lead free solder melting point and under 350 degrees Celsius.

Example 26 includes the subject matter of Example 24 and Example 25, and optionally, wherein the high voltage package with the PCB is covered by a molding compound.

Example 27 includes the subject matter of Examples 24 to 26, and optionally, wherein the apparatus comprises a thermal interface electrically isolated pad on a top side or a bottom side of the device and an exposed thermal electrically isolated pad.

Example 28 includes the subject matter of Examples 24 to 27, wherein the apparatus comprises a plurality of small diameter wire bonds on the GaN transistor on Si FET die and the Si MOSFET die, the plurality of small diameter wire bonds provide a low stray inductance and a high temperature cycling reliability.

What is claimed is:

1. A series connection of at least two GaN on Si substrate switching units adapted to extend an operational voltage range beyond a breakdown voltage of each switching unit, each comprising:
    a first transistor, where the source of the first transistor of a switching unit of the at least two switching units is connected to the drain of the first transistor of the following switching unit;
    the source of each first transistor is connected to its Si substrate via an external resistor;
    the drain of each first transistor is connected to an internal, voltage controlled resistance that is formed in an internal buffer layer epitaxial structure of GaN on Si substrate of the first transistor, to form together with the external resistor circuitry adapted to maintain substantially the same voltage drop across each of the first transistors of the series connection.

2. The series connection of claim 1, further comprising:
    an internal, voltage controlled capacitance that is formed in the internal buffer layer epitaxial structure of GaN on Si substrate of the first transistor, connected between the drain and source of the first transistor, adapted maintain substantially the same AC voltage drop on each of the first transistors of the series connection.

3. The series connection of claim 1, wherein the gate of each of the first transistors is connected to an isolated synchronized driver.

4. The series connection of claim 3 wherein each of the isolated drivers is controlled by the same PWM signal.

5. The series connection of claim 1, wherein each of the switching units further comprising:
    a protection transistor connected in series between the source of the respective first transistor and the drain of the first transistor of the following switching unit;
    enable circuitry to control the operation of the driver of the respective first transistor and the operation of the protection transistor to prevent excessive current via the respective first transistor.

6. The series connection of claim 1 wherein the resistance of the internal resistor is in the range of 0.1MΩ to 100MΩ.

7. The series connection of claim 5, wherein each of the first transistors is either a D-mode or E-mode transistor.

* * * * *

UNITED STATES PATENT AND TRADEMARK OFFICE
CERTIFICATE OF CORRECTION

| | | |
|---|---|---|
| PATENT NO. | : 10,298,227 B2 | |
| APPLICATION NO. | : 15/706121 | |
| DATED | : May 21, 2019 | |
| INVENTOR(S) | : Gregory Bunin et al. | |

It is certified that error appears in the above-identified patent and that said Letters Patent is hereby corrected as shown below:

On the Title Page

Item (72) Inventors should read: Gregory Bunin, Tel-Aviv (IL); David Shapiro, Rishon LeZion (IL); Lev Stessin, Ashkelon (IL); Ivan Fedorov, Bat Yam (IL)

Signed and Sealed this
Twenty-third Day of August, 2022

Katherine Kelly Vidal
*Director of the United States Patent and Trademark Office*